US006835674B2

(12) United States Patent
Doan et al.

(10) Patent No.: US 6,835,674 B2
(45) Date of Patent: Dec. 28, 2004

(54) METHODS FOR TREATING PLURALITIES OF DISCRETE SEMICONDUCTOR SUBSTRATES

(75) Inventors: Trung Tri Doan, Boise, ID (US); Lyle D. Breiner, Meridian, ID (US); Er-Xuan Ping, Meridian, ID (US); Lingyi A. Zheng, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/836,922

(22) Filed: Apr. 30, 2004

(65) Prior Publication Data

US 2004/0203232 A1 Oct. 14, 2004

Related U.S. Application Data

(62) Division of application No. 10/349,717, filed on Jan. 22, 2003, which is a division of application No. 10/099,216, filed on Mar. 13, 2002.

(51) Int. Cl.[7] .......................... H01L 21/44; H01L 21/31; H01L 21/469
(52) U.S. Cl. ....................................... 438/791; 438/680
(58) Field of Search ................................ 438/680, 791; 118/715, 728

(56) References Cited

U.S. PATENT DOCUMENTS

| 4,058,430 | A |   | 11/1977 | Suntola et al. | 158/611 |
|---|---|---|---|---|---|
| 4,389,973 | A |   | 6/1983 | Suntola et al. | 118/725 |
| 5,281,274 | A |   | 1/1994 | Yoder | 118/697 |
| 5,879,459 | A |   | 3/1999 | Gadgil et al. | 118/715 |
| 6,024,799 | A | * | 2/2000 | Chen et al. | 118/715 |
| 6,124,158 | A |   | 9/2000 | Dautartas et al. | 438/216 |
| 6,147,013 | A | * | 11/2000 | Sun et al. | 438/791 |
| 6,174,809 | B1 |   | 1/2001 | Kang et al. | 438/682 |
| 6,306,216 | B1 | * | 10/2001 | Kim et al. | 118/725 |
| 6,342,277 | B1 |   | 1/2002 | Sherman | 427/562 |
| 6,468,924 | B2 |   | 10/2002 | Lee et al. | 438/763 |
| 6,585,823 | B1 | * | 7/2003 | Van Wijck | 117/89 |
| 6,592,942 | B1 |   | 7/2003 | Van Wijck | 427/255 |
| 2002/0043216 | A1 |   | 4/2002 | Hwang et al. | 118/723 |
| 2002/0086476 | A1 |   | 7/2002 | Kim | 438/200 |
| 2002/0098627 | A1 | * | 7/2002 | Pomarede et al. | 438/149 |
| 2003/0013320 | A1 |   | 1/2003 | Kim et al. | 438/778 |
| 2003/0036268 | A1 |   | 2/2003 | Brabant et al. | 438/689 |
| 2003/0040196 | A1 |   | 2/2003 | Lim et al. | 438/785 |

(List continued on next page.)

FOREIGN PATENT DOCUMENTS

| EP | 1 069 599 A2 | 1/2001 |
|---|---|---|
| JP | 2001 172 767 A | 6/2001 |

OTHER PUBLICATIONS

Kukli et al., "Atomic Layer Epitaxy Growth of Tantalum Oxide Thin Films from $Ta(OC_2H_5)_5$ and $H_2O$", Journal of the Electrochemical Society 142(5), May 1995, pp. 1670–1674.

(List continued on next page.)

Primary Examiner—Alexander Ghyka
(74) Attorney, Agent, or Firm—Wells St. John P.S.

(57) ABSTRACT

The invention includes a method for treating a plurality of discrete semiconductor substrates. The discrete semiconductor substrates are placed within a reactor chamber. While the substrates are within the chamber, they are simultaneously exposed to one or more of H, F and Cl to remove native oxide. After removing the native oxide, the substrates are simultaneously exposed to a first reactive material to form a first mass across at least some exposed surfaces of the substrates. The first reactive material is removed from the reaction chamber, and subsequently the substrates are exposed to a second reactive material to convert the first mass to a second mass. The invention also includes apparatuses which can be utilized for simultaneous ALD treatment of a plurality of discrete semiconductor substrates.

20 Claims, 2 Drawing Sheets

U.S. PATENT DOCUMENTS

2003/0176047 A1 * 9/2003 Doan et al. ............... 438/478
2003/0176057 A1 * 9/2003 Doan et al. ............... 438/628
2003/0176060 A1 * 9/2003 Doan et al. ............... 438/646
2003/0176061 A1 * 9/2003 Doan et al. ............... 438/685
2003/0186515 A1 * 10/2003 Dean et al. ............... 438/478

OTHER PUBLICATIONS

Kukli et al., "Properties of $Ta_2O_5$–Based Dielectric Nanolaminates Deposited by Atomic Layer Epitaxy", Journal of the Electrochemical Society 144(1), Jan. 1997, pp. 300–306.

Niinisto, "Advanced Thin Films for Electronics and Optoelectronics by Atomic Epitaxy",IEEE, Jun. 2000, pp. 33–42.

Suntola, "Surface chemistry of materials deposition at atomic layer level", Applied Surface Science 100/101, 1996 Elsevier Science, pp. 391–398.

Siimon et al., "Modeling of Precursor Flow and Deposition in Atomic Layer Deposition Reactor", Journal de Physique IV, vol. 5, Jun. 1995, tile page and pp. C5–245 to C5–252.

* cited by examiner

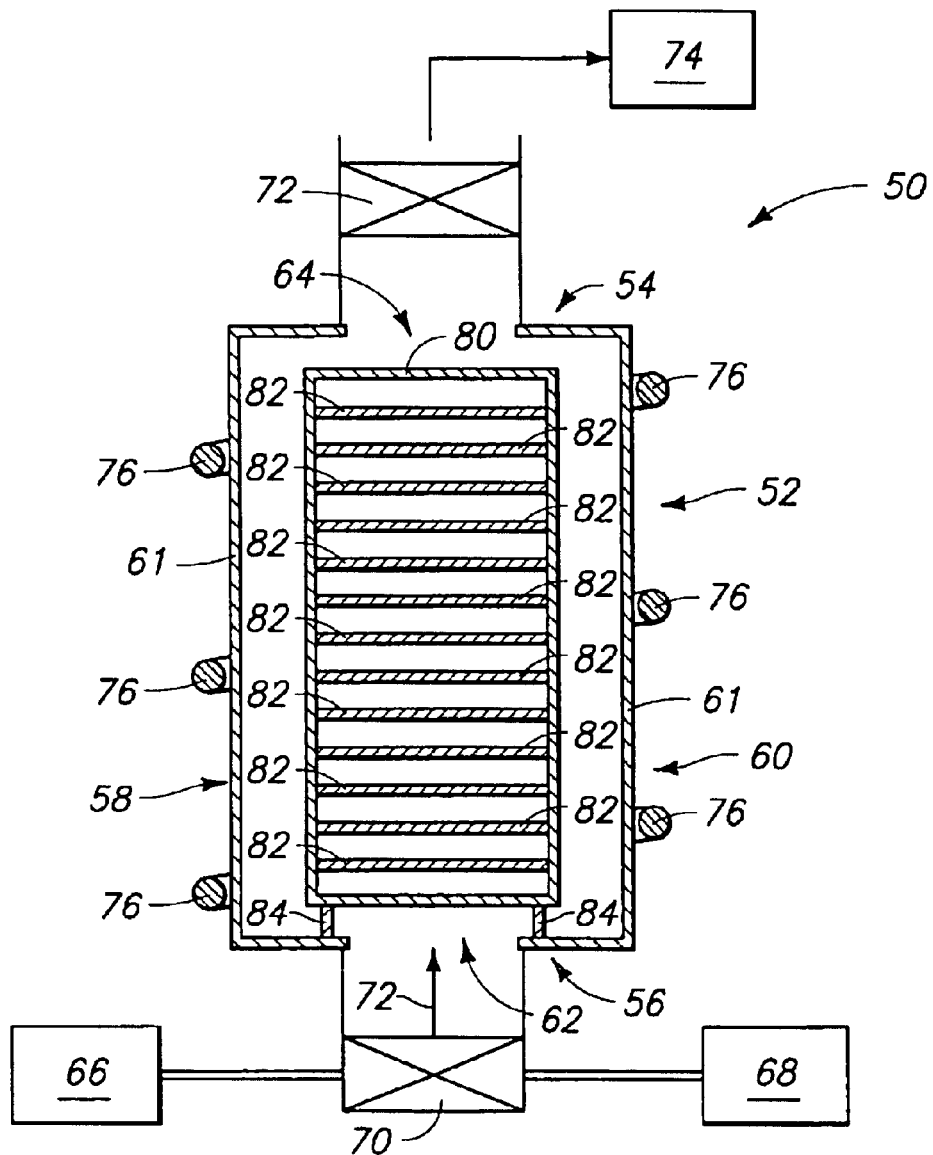

METHODS FOR TREATING PLURALITIES OF DISCRETE SEMICONDUCTOR SUBSTRATES

RELATED PATENT DATA

This patent is a divisional application of U.S. patent application Ser. No. 10/349,717, filed Jan. 22, 2003, entitled "Methods for Treating Pluralities of Discrete Semiconductor Substrates", naming Trung Tri Doan. Lyle D. Breiner, Er-Xuan Ping, and Lingyi A. Zheng as inventors; which is a divisional of U.S. patent application Ser. No. 10/099,216, filed Mar. 13, 2002, entitled "Methods for Treating Pluralities of Discrete Semiconductor Substrates", naming Trung Tri Doan, Lyle D. Breiner. Er-Xuan Ping, and Lingyi A. Zheng as inventors; the disclosures of which are incorporated by reference.

The invention pertains to methods for treating pluralities of discrete semiconductor substrates to form layers of material over the substrates. In particular applications, the invention pertains to atomic layer deposition of materials over semiconductor substrates. The invention also pertains to apparatuses which can be utilized during treatment of a plurality of discrete semiconductor substrates.

BACKGROUND OF THE INVENTION

It is frequently desired to form high quality layers of material over semiconductor substrates during semiconductor device fabrication. Among the materials which can be included in such layers are tantalum pentoxide, titanium nitride, titanium silicon nitride, tantalum nitride, tantalum silicon nitride, titanium silicide, tantalum silicide, tungsten nitride, aluminum oxide, hafnium oxide, zirconium oxide, silicon nitride, silicon dioxide, elemental tungsten and elemental titanium. Numerous methods have been developed for forming layers of such materials, with exemplary methods including chemical vapor deposition (CVD), and in some cases atomic layer deposition (ALD).

Chemical vapor deposition comprises mixing two or more reactants in a chamber to form a material which subsequently deposits across exposed surfaces of one or more semiconductor substrates. An advantage of chemical vapor deposition is that it can be utilized in batch processes, or, in other words, can be utilized to simultaneously treat a plurality of discrete sem-iconductor substrates. Among the disadvantages of chemical vapor deposition is that it can be difficult to control reactions between the reactants provided in a chamber, and accordingly various side-reactions can occur to generate contaminants. Additionally, it can be difficult to form a uniform layer over multiple exposed surfaces of one or more semiconductor substrates with CVD. The deposition of CVD material can be faster in various regions of semiconductor typography than other regions, leading to non-uniformity in a thickness of the deposited material across various exposed surfaces of semiconductor substrates provided within a CVD reaction chamber.

ALD can overcome some of the problems discussed above relative to CVD. ALD processing typically comprises forming thin films of material by repeatedly depositng monoatomic layers. The technique involves individually depositing precursors, or reactants, that react in situ to form a desired film of material across a semiconductor substrate. More specifically, ALD processes involve introduction of a first reactant which reacts with a substrate to form a monolayer across the substrate. The first reactant will typically react with the substrate, but not with itself. Accordingly, side-reactions are eliminated. Further, the reaction of the reactant with the substrate is self-limiting, in that once a monolayer forms across exposed surfaces of the substrate there is no longer further reaction of the reactant with the substrate.

After the monolayer is formed, the first reactant is flushed from the processing chamber, and a second reactant is subsequently introduced. The second reactant reacts with the monolayer of material formed from the first reactant to convert such monolayer into a desired mass over the substrate. The desired mass can be uniformly thick across the various surfaces of the substrate. The mass can be made thicker by repeating the above-described process. Specifically, the mass can become an upper surface of a semiconductor substrate, and can be utilized for reaction with the first reactant. Subsequently, the second reactant can be introduced to form a second layer of the mass over the first layer. The process can be repeated until a desired thickness of the mass is formed.

A problem with existing ALD technologies is that such are not typically suitable for utilization in batch processes. Rather, semiconductor substrates are treated one at a time, and throughput of substrates through ALD processes is thus low relative to CVD processes. Some effort has recently been made to develop batch processes for ALD of silicon nitride. Specifically, a batch of wafers is exposed to trichlorosilane in a reaction chamber to form a silicon-containing monolayer over exposed surfaces of the substrates. Subsequently; the trichlorosilane is evacuated from the chamber and ammonia is introduced to convert the silicon-containing material to silicon nitride. The trichlorosilane deposition occurs at a temperature at least 150° C. different than the ammonia treatment.

It would desirable to extend batch ALD processes to other materials besides silicon nitride. It would also be desirable to develop improved processes for batch ALD of silicon nitride.

SUMMARY OF THE INVENTION

In one aspect, the invention encompasses a method for treating a plurality of discrete semiconductor substrates. The discrete semiconductor substrates are placed within a reactor chamber. While the substrates are within the chamber, they are simultaneously exposed to one or more of H, F and Cl to remove native oxide (such can be considered an in situ cleaning of the substrates). After removing the native oxide, the substrates are simultaneously exposed to a first reactive material to form a first mass across at least some exposed surfaces of the substrates. The first reactive material is removed from the reaction chamber, and subsequently the substrates are exposed to a second reactive material to convert the first mass to a second mass.

In one aspect, the invention encompasses a method in which a plurality of discrete semiconductor substrates are placed within a reaction chamber and simultaneously exposed to a first reactive material to form a first mass across at least some exposed surfaces of the substrates. The first reactive material is removed from the reaction chamber, and subsequently the substrates are exposed to a second reactive material to convert the first mass to a second mass. The second mass comprises one or more of tantalum, titanium, tungsten, aluminum, hafnium, SiO and Zr, with the listed composition of SiO being shown in terms of the elements contained therein rather than in terms of a stoichiometric relationship with the elements.

In one aspect, the invention encompasses a method in which a plurality of discrete semiconductor substrates are treated within a reaction chamber. The substrates are first exposed to a first reactive material to form a first mass across at least some exposed surfaces of the substrates, with the substrates being held at a first temperature during the exposure to the first reactive material. The first reactive material is then removed from the reaction chamber. Next, the substrates are exposed to a second reactive material to convert the first mass to a second mass, with the substrates being at a temperature within about 100° C. of the first temperature during the exposing to the second reactive material. It is noted that in particular aspects of the invention, the temperature of the substrates during exposure to the first reactive material can vary by more than 100° C. relative to the temperature of the substrates during exposure to the second reactive material.

Various aspects of the invention can utilize a fast ramp furnace to control the temperature of substrates exposed to reactive materials, and the purging of reactive materials from a reaction chamber can occur during ramp-up and/or ramp-down of the temperature of substrates within the chamber.

Various aspects of the invention can utilize remote assisted chemical activated methodologies to enhance atomic layer deposition. For example, plasma-assist and/or pre-heating of materials can be utilized in methodology of the present invention.

In one aspect, the invention encompasses apparatuses which can be utilized for treating a plurality of discrete semiconductor substrates. The apparatuses can be particularly well suited for atomic layer deposition.

BRIEF DESCRIPTION OF THE DRAWINGS

Preferred embodiments of the invention are described below with reference to the following accompanying drawings.

FIG. 4 is a diagrammatic, cross-sectional view of a reaction chamber which can be utilized in various methods associated with the present invention. The reaction chamber is shown at an exemplary processing step, and accordingly has a plurality of discrete semiconductor substrates shown therein.

DETAILED DESCRIPTION OF THE PREFERRED EMBODIMENTS

Figure 1:
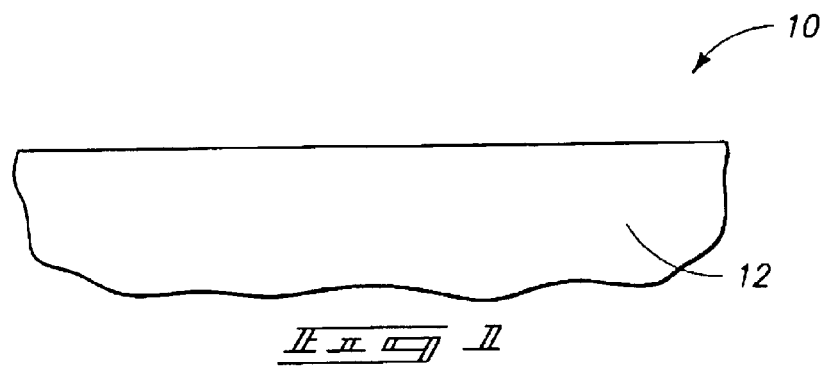
FIG. 1 is a diagrammatic, cross-sectional view of a semiconductor wafer fragment shown at a preliminary processing step of an exemplary method of the present invention.

In particular aspects, the present application pertains to atomic layer deposition (ALD) technology. ALD technology typically involves formation of successive atomic layers on a substrate. Such layers may comprise, for example, an epitaxial, polycrystalline, and/or amorphous material. ALD may also be referred to as atomic layer epitaxy, atomic layer processing, etc.

The deposition methods herein are described in the context of formation of materials on one or more semiconductor substrates. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of the present document, "metal" or "metal element" refers to the elements of Groups IA, IIA, and IB to VIIIB of the periodic table of the elements along with the portions of Groups IIIA to VIA designated as metals in the periodic table, namely, Al, Ga, In, Tl, Ge, Sn, Pb, Sb, Bi, and Po. The Lanthanides and Actinides are included as part of Group IIIB. "Non-metals" refers to the remaining elements of the periodic table.

Described in summary, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. It is noted that one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. The various aspects of the present invention described herein are applicable to any circumstance where ALD may be desired. It is further noted that local chemical reactions can occur during ALD (for instance, an incoming reactant molecule can displace a molecule from ah existing surface rather than forming a monolayer over the surface). To the extent that such chemical reactions occur, they are generally confined within the uppermost monolayer of a surface.

Traditional ALD can occur within an frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form nonselectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition species that chemisorbs to a substrate or previously deposited species. An ALD process regime may provide a simultaneously contacted plurality of species of a type or under conditions such that ALD chemisorption, rather than CVD reaction occurs. Instead of reacting together, the species may chemisorb to a substrate or previously deposited species, providing a surface onto which subsequent species may next chemisorb to form a complete layer of desired material.

Under most CVD conditions, deposition occurs largely independent of the composition or surface properties of an underlying substrate. By contrast, chemisorption rate in ALD might be influenced by the composition, crystalline structure, and other properties of a substrate or chemisorbed species. Other process conditions, for example, pressure and temperature, may also influence chemisorption rate. Accordingly, observation indicates that chemisorption might not occur appreciably on portions of a substrate though it occurs at a suitable rate on other portions of the same substrate. Such a condition may introduce intolerable defects into a deposited material.

An exemplary ALD process is described with reference to FIGS. 1–3. Referring initially to FIG. 1, a semiconductor construction 10 is illustrated. Construction 10 comprises a semiconductor substrate 12. Substrate 12 can comprise, for example, a monocrystalline silicon having one or more materials (not shown) supported thereby. In particular applications, substrate 12 can comprise a monocrystalline silicon wafer that is ultimately to have various integrated circuit devices formed thereover. The devices can be at various stages of completion in the processing of FIG. 1. The various devices which can be associated with substrate 12 will be recognized by persons of ordinary skill in the art, and are not shown in the diagrammatic illustration of FIG. 1.

Figure 2:
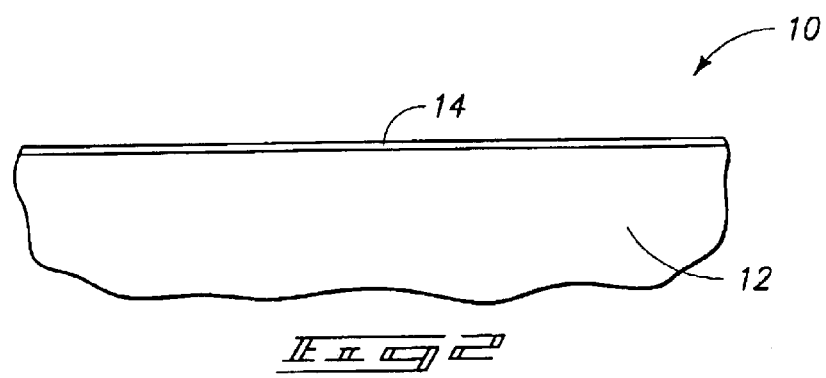
FIG. 2 is a view of the FIG. 1 wafer fragment shown at a processing step subsequent to that of FIG. 1.
Figure 3:
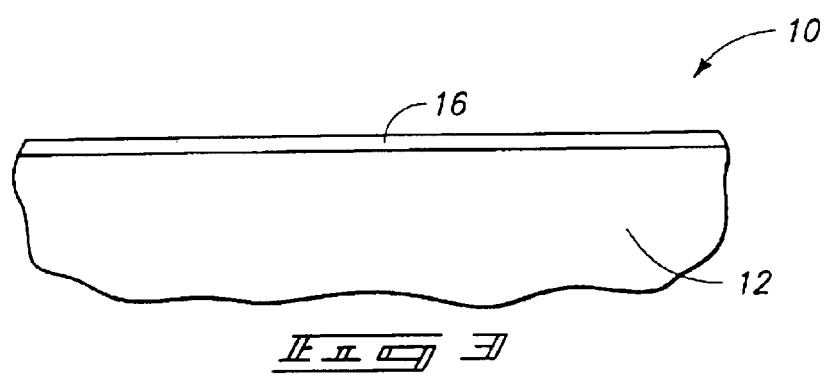
FIG. 3 is a view of the FIG. 1 wafer fragment shown at a processing step subsequent to that of FIG. 2.

Referring to FIG. 2, construction 10 is shown at a processing step subsequent to that of FIG. 1. Specifically, the construction is illustrated after a monolayer 14 has been formed across substrate 12. Monolayer 14 can be formed by placing construction 10 within a reaction chamber, and exposing the construction to a suitable ALD reactant to generate the monolayer 14. After monolayer 14 is formed, the reaction chamber can be purged of the reactant utilized to generate the monolayer. Subsequently, a second reactant can be introduced to convert monolayer 14 into a desired mass 16, which is illustrated in FIG. 3. In subsequent cycles, the combined mass 16 and substrate 12 can be considered a new substrate for ALD deposition, and subjected to the processing described with reference to FIGS. 2 and 3 to increase a thickness of mass 16. Alternatively, or additionally, mass 16 can be subjected to a third reactant to convert the mass to yet another desired material.

In exemplary processing, mass 16 can comprise one or more of TaO, TiN, TiSiN, TaSiN, TaSi, TaN, WN, W, Ti, Al, O, HfO, ZrO, SiO, SiN, TiSi, and WSi; with the listed compositions being shown in terms of the elements contained therein rather than in terms of a stoichiometric relationship of the elements. Accordingly, the indicated SiO can be in the form of silicon dioxide ($SiO_2$), and the indicated SiN can be in the form of silicon nitride ($Si_3N_4$). In further particular embodiments, the mass 16 can consist of, or consist essentially of, TaO, TiN, TiSiN, TaSiN, TaSi, TaN, WN, W, Ti, AlO, HfO, ZrO, SiO, SiN, TiSi, WSi, and SiON; with the list of compositions being shown in terms of the elements contained therein, rather than in terms of a stoichiometric relationship with the elements.

Mass 16 can be exposed to post-formation processing to convert the mass to another material. For instance, if mass 16 comprises SiN, the mass can be exposed to oxygen to form SiON from the SiN (with the composition SiON being shown in terms of the elements contained therein, rather than in terms of a stoichiometric relationship with the elements). The exposure to oxygen can comprise exposure to one or more of $O_2$, $O_3$, and $H_2O_2$.

Numerous methods can be utilized for forming various of the above-described materials of mass 16. In an exemplary method, mass 16 comprises $Ta_2O_5$. Such mass can be formed utilizing a first reactive material comprising, consisting essentially of, or consisting of tantalum pentaethoxide to generate the first mass 14 (FIG. 2), and then utilizing a second reactive material comprising, consisting essentially of, or consisting of ozone to convert the first mass 14 to the second mass 16 (FIG. 3) of $Ta_2O_5$.

In another exemplary embodiment, a first reactive material comprising, consisting essentially of, or consisting of $TiCl_4$ is utilized to generate first mass 14, and a second reactive material comprising, consisting essentially of, or consisting of $NH_3$ is utilized to convert first mass 14 into a second mass 16 comprising TiN.

In another exemplary embodiment, the first reactive material can comprise, consist essentially of, or consist of $TiCl_4$ and be utilized to generate the first mass 14, and such can subsequently be exposed to a second reactive material which contains silicon to generate second mass 16 comprising, consisting essentially of, or consisting of Ti and Si. Such mass 16 can be referred to as comprising $Ti_tSi_x$, with t and x being greater then 0. The silicon-containing reactive material can comprise, consist essentially of, or consist of, for example, silane. In further processing, the mass 16 can be exposed to a third reactive material comprising $NH_3$ to convert the mass to $Ti_tSi_xN_y$, with t, x and y being greater than 0. Alternatively, the second reactive material can comprise $H_2O$ and mass 16 can comprise $TiO_2$.

In further exemplary processing, a first reactive material comprising, consisting essentially of, or consisting of $TaCl_5$ can be utilized to generate first mass 14, and such can subsequently be exposed to a second reactive material comprising silicon to form the second mass 16 comprising, consisting essentially of, or consisting of Ta and Si. The silicon-containing material can comprise, consist essentially of, or consist of, for example, silane. The mass comprising Ta and Si can be, for example, $Ta_tSi_x$, where t and x are greater than 0. In further processing, the mass comprising Ta and Si can be exposed to a reactive material comprising, consisting essentially of, or consisting of $NH_3$ to convert the mass to $Ta_tSi_xN_y$, with t, x and y being greater than 0.

In yet other exemplary processing, the first reactive material can comprise, consist essentially of, or consist of $WF_6$ to form the first mass 14, and such mass can then be exposed to a second reactive material comprising silicon to generate the second mass 16 comprising, consisting essentially of, or consisting of $W_tSi_x$, with t and x being greater than 0. The silicon-containing reactive material can comprise, consist essentially of or consist of, for example, silane.

In yet other exemplary processing, the first reactive material can comprise, consist essentially of, or consist of $TaF_5$ and be utilized to generate first mass 14. The first mass can then be exposed to a second reactive material comprising, consisting essentially of, or consisting of $NH_3$, to form the second mass 16 comprising, consisting essentially of, or consisting of $Ta_tN_x$, with t and x being greater than 0.

In yet other exemplary processing, the first reactive material can comprise $WF_6$ to generate the first mass 14. The first mass 14 can then be exposed to a second reactive material comprising, consisting essentially of, or consisting of $NH_3$ to generate the second mass 16 comprising $W_tN_x$, with t and x being greater than 0. Alternatively, the second reactive material can comprise, consist essentially of, or consist of $H_2$, to generate the second mass 16 comprising, consisting essentially of, or consisting of W.

In yet other exemplary processing, the mass 16 can comprise, consist essentially of, or consist of Ti; and can be formed from a first reactive material comprising, consisting essentially of, or consisting of $TiCl_4$, and a second reactive material comprising, consisting essentially of, or consisting of $H_2$.

In yet other exemplary processing, the mass 16 can comprise, consist essentially of, or consist of $SiO_2$; and can be formed from a first silicon-containing reactive material and a second reactive material comprising oxygen. The first silicon-containing material can comprise, consist essentially of, or consist of, for example, silane or trichlorosilane. The oxygen-containing reactive material can comprise, consist essentially of, or consist of one or more of $O_2$, $O_3$, and $H_2O_2$.

In yet another embodiment, mass 16 can comprise $Al_2O_3$, and can be formed from a first reactive material comprising, consisting essentially of, or consisting of $Al(CH_3)_3$, and a second reactive material comprising, consisting essentially of, or consisting of $H_2O$.

In another exemplary embodiment, mass 16 can comprise, consist essentially of, or consist of ZrO, with the composition being shown in terms of the elements contained therein rather than in terms of a stoichiometric relationship of the elements (typically the composition would be $ZrO_2$). In such embodiment, the first reactive material can comprise, consist essentially of, or consist of $ZrCl_4$, and the second reactive material can comprise, consist essentially of, or consist of $H_2O$.

In another exemplary embodiment, the mass 16 can comprise, consist essentially of, or consist of HfO, with the listed composition being shown in terms of the elements contained therein rather than in terms of a stoichiometric relationship of the elements (typically the composition would be $HfO_2$). The first reactive material can comprise, consist essentially of, or consist of $HfCl_4$, and the second reactive material can comprise, consist essentially of, or consist of $H_2O$.

In yet other exemplary embodiments, various cycles of ALD can be utilized to incorporate mass 16 into a laminate comprising $Al_2O_3$ and tantalum, or a laminate comprising $Al_2O_3$ and one or more of $Ta_2O_5$, $HfO_2$, $ZrO_2$ and $SiO_2$. Alternatively, mass 16 can be incorporated into a laminate consisting essentially of $Al_2O_3$ and $SiO_2$.

In particular aspects, the invention pertains to methods in which a plurality of discrete semiconductor substrates are simultaneously subjected to ALD within a common reaction chamber. Such aspects are described with reference to an exemplary apparatus 50 in FIG. 4. Apparatus 50 comprises a reaction chamber 52. Chamber 52 has a top 54, a bottom 56, a first vertical segment 58, and a second vertical segment 60. First vertical segment 58 is in opposing relation relative to second vertical segment 60, and top 54 is in opposing relation relative to bottom 56. Chamber 52 can comprise a cylindrical shape such that sides 58 and 60 are part of a common curved lateral periphery of the chamber. Alternatively, chamber 52 can comprise a rectangular or square shape.

Chamber 52 comprises a wall 61 which defines a periphery of the chamber. An inlet port 62 extends through wall 61 at bottom 56 of the chamber, and an outlet port 64 extends through wall 61 at top 54 of the chamber. Top 54 and bottom 56 can be considered to be sides of chamber 52 (i.e. a top side and a bottom side) which are opposed relative to one another, and can be referred to as a first sidewall and second sidewall, respectively.

Inlet 62 is in fluid communication with a source 66 of first reactive material, and a source 68 of second reactive material. Materials from sources 66 and 68 flow through a valve 70 and into chamber 52 along the direction designated by arrow 72. Valve 70 is preferably configured to allow only one of the reactive materials to flow into chamber 52 at any given time. Accordingly, apparatus 50 is configured for utilization in an ALD process, rather than a CVD process. The shown configuration of having two reaction components configured to flow through a single valve 70 into chamber 52 is an exemplary embodiment, and an apparatus of the present invention can have other configurations. For instance, more than two sources of reactive gases can be in fluid communication with inlet port 62 through a valve. Further, multiple valves can be utilized so that each reactive component flows through a separate valve relative to the other reactive components. Additionally, a source of purge gas can be provided in fluid communication with inlet 62 to simplify purging of a first reactive material from within chamber 52 prior to introduction of a second reactive material into the chamber.

Outlet port 64 is in fluid communication through a valve 72 with a pump 74. Pump 74 can be utilized to evacuate chamber 52 prior to introduction of a reactive material into the chamber, as well as to rapidly pull reactive materials through the chamber.

A plurality of heating coils 76 are shown extending around chamber 52. Coils 76 can be utilized to heat chamber wall 61 during an ALD operation. Such can reduce or eliminate side reactions from occurring relative to wall 61. The side reactions can be problematic if wall 61 is cold relative to semiconductor substrate surfaces which are being treated within chamber 52, as many of the reactive components utilized in ALD can react at or near cold chamber walls. Construction 50 can be considered a furnace due to the inclusion of heating elements 76 within the construction.

A holder 80 is provided within chamber 52, and such retains a plurality of semiconductor substrates 82. The substrates 82 are shown with cross-hatching to assist the reader in visualizing the structures, and not to indicate any conductivity or material compositions of the structures. Each of the substrates 82 can be considered as being discrete relative to the other substrates 82 retained within the chamber.

Holder 80 comprises legs 84 which elevate a base of holder 80 above an internal bottom surface of wall 61. Various additional heating elements (not shown) can be included within construction 50 to heat the individual semiconductor substrates 82 retained within the chamber.

In operation, a plurality of discrete semiconductor substrates are provided within chamber 52, and subsequently a first reactive material is flowed into the chamber. At least some of the exposed surfaces of the discrete semiconductor substrates react with the first reactive material so that a layer (typically a monolayer) is formed over at least some of the exposed surfaces. In particular embodiments, all of the exposed surfaces of the semiconductor substrates have a monolayer formed thereover. In such embodiments, back surfaces of the semiconductor substrates can be retained within a protective structure so that the monolayer is not formed on such back surfaces. The monolayer can be considered as a first mass formed across the exposed surfaces of the plurality of discrete semiconductor substrates. The substrates are preferably held at a first temperature during the exposure to the first reactive material. An exemplary temperature can be from about 300° C. to about 700° C. Such temperature can be particularly useful in applications in which the first reactive material is a silicon-containing precursor, such as, for example, trichlorosilane.

Substrates 82 can be exposed to the reactive material for a sufficient time to saturate exposed surfaces of the substrates with a desired mass. For instance, if the substrates are exposed to a silicon-containing reactive precursor to form a silicon-containing mass, the substrates will preferably be exposed for a sufficient time to saturate exposed surfaces of the substrates with the silicon-containing mass. If the silicon-containing precursor comprises trichlorosilane, and the exposed surfaces comprised silicon, a suitable exposure time can be at least about 5 minutes.

After the exposure of substrates 82 to the first reactive material, pump 74 can be utilized to evacuate the first reactive material from within chamber 52. A purge gas can be flushed through the chamber during such evacuation.

After the first reactive material is purged from within chamber 52, a second reactive material is introduced into the chamber. The second reactive material converts the first mass into a second mass. In an exemplary embodiment in which the first mass is formed from trichlorosilane, the second reactive material can comprise a nitrogen-containing precursor, such as, for example, ammonium, to convert the first mass into silicon nitride.

It can be preferred that the discrete semiconductor substrates are held at a temperature during exposure to the second reactive material which is comparable to the temperature utilized during exposure to the first reactive material. In particular embodiments, the semiconductor substrates can be held at a temperature during exposure to the second reactive material which is within about 100° C. of the temperature utilized during exposure to the first reactive material, within about 50° C. of the temperature utilized during exposure to the first reactive material, within about 25° C. of the temperature utilized during the first reactive material, within about 10° C. of the temperature utilized during exposure to the first reactive material, within about 5° C. of the temperature utilized during exposure to the first reactive material, or even within about 1° C. of the temperature utilized during exposure to the first reactive material.

An advantage of utilizing about the same temperature during exposure of substrates 82 to the second reactive material as is utilized during exposure to the first reactive material is that such can simplify a thermal cycle utilized during an ALD process. An additional advantage is that substrates 82 will not be exposed to substantially different thermal temperatures during the ALD process, which can alleviate formation of thermally-induced defects within substrates 82.

Heating elements 76 can be utilized to ensure that reaction chamber 52 has hot internal walls during exposure of the discrete semiconductor substrates to the first and second reactive materials, and specifically to ensure that the internal wall temperature is about the same as the temperature of the semiconductor substrates during exposure to the first and second reactive materials. If the internal wall temperature is about the same as the temperature of the substrates during exposure to the first and second reactive materials, such can alleviate or eliminate generation of contaminates within chamber 52. Further, to the extent that side reactions occur at the walls of chamber 52, such reactions will be occurring at the same temperature as substrates 82 are exposed to, and accordingly the side reactions can generate the same materials as are being deposited on substrates 82. Thus, if the materials from the side reactions inadvertently fall from walls of chamber 52 onto the substrates, they may simply be additional desired material on the substrates rather than contaminating material.

The exemplary pressure within chamber 52 during exposure of substrates 82 to the first and second reactive materials is typically at least about 1 Torr, and can be equal to or greater than atmospheric pressure.

An advantage of utilizing the chamber construction 52 of FIG. 4 is that such can enable rapid flushing of a chamber between ALD cycles, as well as rapid ramping of a pressure within the chamber to a desired level when filling the chamber with reactive material. Chamber 52 can be considered to comprise an upper sidewall 54 having a first internal surface area. Outlet port 64 extends through upper sidewall 54, and thus reduces the internal surface area of the sidewall. In other words, there is less of sidewall 54 present due to the opening of outlet 64 than there would be if there was no opening of outlet 64. The size of outlet 64 is preferably large enough relative to sidewall 54 to enable rapid flushing of materials from within chamber 52. Accordingly, outlet port 64 preferably reduces an internal surface area of sidewall 54 by at least about 30 percent, more preferably by at least about 50 percent, yet more preferably by at least about 70 percent, and even more preferably by at least 90 percent.

Similarly, inlet port 62 reduces an internal surface area of sidewall 56, and preferably inlet port 62 is large enough relative to sidewall 56 to enable rapid transfer of reactive materials into chamber 52. Accordingly, inlet port 62 preferably reduces an internal surface area of sidewall 56 by at least about 30 percent, more preferably by at least about 50 percent, yet more preferably by at least about 70 percent, and even more preferably by at least about 90 percent.

In a particular aspect of the invention, the relative size of inlet port 62 and/or outlet port 64 to chamber 52 can be adjustable.

In exemplary embodiments, methodology of the present invention can include various pretreatments of semiconductor substrates within a reaction chamber prior to an ALD process occurring in the same reaction chamber. For instance, semiconductor substrates containing silicon will frequently have native oxide ($SiO_2$) formed thereover. Such native oxide can be problematic in various semiconductor constructions, and accordingly it can be desired to remove the native oxide prior to an ALD process. In particular methodology of the present invention, a plurality of substrates 82 are provided within a reaction chamber 52, and the substrates are exposed to one or more of H, F, and Cl to remove native oxide from the semiconductor substrates. After the native oxide is removed, the substrates are exposed to an ALD process within the chamber, which comprises exposure of the substrates to a first reactive material, purging of the first reactive material from within the chamber, and subsequent exposing of the substrates to a second reactive material.

The removal of the native oxide can comprise, for example, exposing the semiconductor substrates to $H_2$ at a temperature of at least about 750° C. Alternatively, the native oxide removal can comprise exposing the semiconductor substrates to at least one plasma-activated species of hydrogen. Such plasma-activated species of hydrogen can be introduced into chamber 52 through a separate port (not shown). The separate port can be in fluid communication with a reaction chamber (not shown) in which one or more hydrogen-containing precursors are exposed to plasma to generate plasma-activated species of hydrogen. The plasma-activated hydrogen-containing species are the fed through the separate port into reaction chamber 52.

Alternatively, the removal of native oxide can comprise exposing the semiconductor substrates to gaseous HCl and/or HF within chamber 52.

In another exemplary pretreatment of semiconductor substrates, the substrates can be exposed to oxygen within chamber 52 to form a uniform layer of oxide across exposed oxidizable surfaces of silicon-containing semiconductor substrates prior to an ALD process. Such can be accomplished by, for example, placing a plurality of semiconductor substrates 82 within chamber 52, and subsequently exposing the substrates to a source of oxygen comprising, consisting of, or consisting essentially of one or more of $O_2$, $O_3$, and $H_2O_2$. After exposure to the oxygen, the reaction chamber 52 can be flushed and subsequently substrates 82 are subjected to an ALD process.

The formation of a uniform layer of oxide over exposed oxidizable surfaces of the substrates can provide a homogeneous base for subsequent formation of materials by ALD.

In compliance with the statute, the invention has been described in language more or less specific as to structural and methodical features. It is to be understood, however, that the invention is not limited to the specific features show and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for treating a plurality of discrete semiconductor substrates, comprising:

providing a reaction chamber comprising a pair of opposing sidewalls, the opposing sidewalls being a first sidewall and second sidewall, the reaction chamber comprising an inlet extending through the first sidewall and an outlet extending through the second sidewall, the first sidewall having a surface area that is reduced by at least about 50% due to the inlet, the second sidewall having a surface area that is reduced by at least about 50% due to the outlet;

placing the plurality of discrete semiconductor substrates in the reaction chamber;

flowing a silicon-containing precursor into the chamber through the inlet to simultaneously expose the plurality of discrete semiconductor substrates to the silicon-containing precursor and form a silicon-containing mass across at least some exposed surfaces of the plurality of discrete semiconductor substrates, the discrete semiconductor substrates being at a first temperature during the exposing to the silicon-containing precursor, the first temperature being from 300° C. to 700° C.;

exhausting the silicon-containing precursor through the outlet to remove the silicon-containing precursor from the reaction chamber; and after the removing, flowing a nitrogen-containing precursor into the chamber through the inlet to simultaneously expose the plurality of discrete semiconductor substrates to the nitrogen-containing precursor and convert the silicon-containing mass to silicon nitride, the discrete semiconductor substrates being within 100° C. of the first temperature during the exposing to the nitrogen-containing precursor.

2. The method of claim 1 wherein the discrete semiconductor substrates are within 50° C. of the first temperature during the exposing to the nitrogen-containing precursor.

3. The method of claim 1 wherein the discrete semiconductor substrates are within 25° C. of the first temperature during the exposing to the nitrogen-containing precursor.

4. The method of claim 1 wherein the discrete semiconductor substrates are within 10° C. of the first temperature during the exposing to the nitrogen-containing precursor.

5. The method of claim 1 wherein the discrete semiconductor substrates are within 5° C. of the first temperature during the exposing to the nitrogen-containing precursor.

6. The method of claim 1 wherein the discrete semiconductor substrates are within 1° C. of the first temperature during the exposing to the nitrogen-containing precursor.

7. The method of claim 1 wherein a pressure within the reaction chamber during the exposure of the plurality of discrete semiconductor substrates to the silicon-containing precursor is at least about 1 torr.

8. The method of claim 1 wherein the plurality of discrete semiconductor substrates are exposed to the silicon-containing precursor for a sufficient time to saturate the at least some of the exposed surfaces of the substrates with the silicon-containing mass.

9. The method of claim 8 wherein the time is at least about 5 minutes.

10. The method of claim 1 further comprising exposing the silicon nitride to oxygen to form SiON from the silicon nitride, with the composition SiON being shown in terms of the elements contained therein rather than in terms of a stoichiometric relationship of the elements.

11. The method of claim 10 wherein the exposure to oxygen comprises exposure to one or more of $O_2$, $O_3$ and $H_2O_2$.

12. The method of claim 1 wherein the first sidewall surface area is reduced by at least about 70% due to the inlet.

13. The method of claim 1 wherein the second sidewall surface area is reduced by at least about 70% due to the outlet.

14. The method of claim 1 wherein the first sidewall surface area is reduced by at least about 70% due to the inlet, and wherein the second sidewall surface area is reduced by at least about 70% due to the outlet.

15. The method of claim 1 wherein the first sidewall surface area is reduced by at least about 90% due to the inlet.

16. The method of claim 1 wherein the second sidewall surface area is reduced by at least about 90% due to the outlet.

17. The method of claim 1 wherein the first sidewall surface area is reduced by at least about 90% due to the inlet, and wherein the second sidewall surface area is reduced by at least about 90% due to the outlet.

18. The method of claim 1 further comprising heating the first and second sidewalls to about the first temperature during the exposure of the plurality of discrete semiconductor substrates to the silicon-containing precursor.

19. The method of claim 1 further comprising heating the first and second sidewalls to about the same temperature as the discrete semiconductor substrates during the exposure of the plurality of discrete semiconductor substrates to the nitrogen-containing precursor.

20. The method of claim 1 further comprising:

heating the first and second sidewalls to about the first temperature during the exposure of the plurality of discrete semiconductor substrates to the silicon-containing precursor; and heating the first and second sidewalls to about the same temperature as the discrete semiconductor substrates during the exposure of the plurality of discrete semiconductor substrates to the nitrogen-containing precursor.

* * * * *

UNITED STATES PATENT AND TRADEMARK OFFICE
CERTIFICATE OF CORRECTION

PATENT NO. : 6,835,674 B2
DATED : December 28, 2004
INVENTOR(S) : Doan et al.

It is certified that error appears in the above-identified patent and that said Letters Patent is hereby corrected as shown below:

Column 1,
Line 17, insert the header -- TECHNICAL FIELD -- before "The invention".
Line 45, please delete "sem-iconductor" after "discrete" and insert -- semiconductor --.

Column 4,
Line 10, please delete "TI" after "In" and insert -- Ti --.

Column 5,
Line 4, please delete "ah" after "from" and insert -- an --.
Line 8, please delete "an" after "within".

Column 7,
Line 55, please delete "$H_{20}$" after "of" and insert -- $H_2O$ --.
Line 64, please delete "$H_{20}$" and insert -- $H_2O$ --.

Column 8,
Line 6, please delete "$H_{20}$" after "of" and insert -- $H_2O$ --.

Column 11,
Line 34, please delete "the" after "are" and insert -- then --.

Signed and Sealed this

Eleventh Day of October, 2005

JON W. DUDAS
*Director of the United States Patent and Trademark Office*